United States Patent [19]

Langdon, Jr.

[11] 4,295,125
[45] Oct. 13, 1981

[54] METHOD AND MEANS FOR PIPELINE DECODING OF THE HIGH TO LOW ORDER PAIRWISE COMBINED DIGITS OF A DECODABLE SET OF RELATIVELY SHIFTED FINITE NUMBER OF STRINGS

[75] Inventor: Glen G. Langdon, Jr., San Jose, Calif.

[73] Assignee: International Business Machines Corporation, Armonk, N.Y.

[21] Appl. No.: 143,986

[22] Filed: Apr. 28, 1980

[51] Int. Cl.³ .......................................... H03K 13/24
[52] U.S. Cl. ............................. 340/347 DD; 364/736
[58] Field of Search ............... 340/347 DD; 235/310, 235/311; 364/736

[56] References Cited

U.S. PATENT DOCUMENTS 4,025,771  5/1977  Lynch ................................ 364/736
4,122,440  10/1978  Langdon et al. ............. 340/347 DD

OTHER PUBLICATIONS

Chen, "Introduction to Computer Architecture", SRA 1975, pp. 375-431.
Hwang, "Computer Arithmetic", ®1979, pp. 379-382, 78-79, 82-87, 91-93.
Abramson, "Information, Theory and Coding", ®1963, pp. 77-85.
Pasco, "Source Coding Algorithms for Fast Data Compression", Doctoral Dissertation, Stanford Univ. ®1976.
Rissanen, "IBM Journal of Research and Development", May 1976, vol. 20, No. 3, pp. 198-203.
Donnan, "IBM Systems Journal", vol. 13, No. 2, pp. 140-162, 1974.
Langdon, "IBM Technical Disclosure Bulletin", vol. 22, No. 6, Nov. 1979.

*Primary Examiner*—Charles D. Miller
*Attorney, Agent, or Firm*—R. Bruce Brodie

[57] ABSTRACT

An apparatus for ensuring continuous flow through a pipeline processor as it relates to the serial decoding of FIFO Rissanen/Langdon arithmetic string code of binary sources. The pipeline decoder includes a processor (11, 23) and a finite state machine (21, FSM) in interactive signal relation. The processor generates output binary source signals (18), status signals (WASMPS, 31) and K component/K candidate next integer-valued control parameters (L0, k0; L1, k1; 25). These signals and parameters are generated in response to the concurrent application of one bit from successive arithmetic code bits, a K component present integer-value control parameter (52) and K component vector representation (T, TA) of the present internal state (51) of the associated finite state machine (FSM). The FSM makes a K-way selection from K candidate next internal states and K candidate next control parameters. This selection uses no more than $K^2+K$ computations. The selected signals are then applied to the processor in a predetermined displaced time relation to the present signals in the processor. As a consequence, this system takes advantage of the multi-state or "memory" capability of an FSM in order to control the inter-symbol influence and facilitate synchronous multi-stage pipeline decoding.

8 Claims, 7 Drawing Figures

BLOCK IDENTIFICATION

RECEIVER BLOCK DIAGRAM

RECEIVER LOGIC INCLUDING THE DECODER AND MODEL UNITS

SIX CALCULATION REQUIRED OF FSM PIPELINE UNIT WITH TWO-VALUED PROCESSOR SIGNAL

A FSM PIPELINE UNIT

DIAGRAM OF SAS UNIT

METHOD AND MEANS FOR PIPELINE DECODING OF THE HIGH TO LOW ORDER PAIRWISE COMBINED DIGITS OF A DECODABLE SET OF RELATIVELY SHIFTED FINITE NUMBER OF STRINGS

TECHNICAL FIELD

This invention relates to a method and means for ensuring continuous flow through a pipeline processor. More particularly, the invention relates to the measures needed to speed up the serial decoding of a FIFO Rissanen/Langdon arithmetic string code of binary sources.

BACKGROUND

The pertinent prior art concerns pipelining computations on one hand and arithmetic string codes on the other. In this regard, reference should be made to T. C. Chen, "Overlap and Pipeline Processing," pages 375-431, Introduction to Computer Architecture, 1975, published by SRA; Kai Hwang, "Computer Arithmetic," pages 379-382; Langdon et al, U.S. Pat. No. 4,122,440; issued Oct. 24, 1978; and the two Langdon and Rissanen co-pending U.S. patent applications U.S. Ser No. 048,318, filed June 14, 1979, and U.S. Ser No. 098,285, filed Nov. 29, 1979.

Chen and Hwang references characterize pipelining as an extreme form of multiple overlap operation upon a data stream in which the completion signals are replaced by synchronizing time clock pulses. Pipelining is further characterized as a processing technique aiming for a steady throughput. As noted by Chen, processing power is decentralized. It is, however, distributed more or less uniformly over the processing path by coupling processing elements into a chain. One can observe precedence dependence and still achieve a total work rate equal to the sum of the work rate of each of the processing elements. In this type of environment, throughput suffers when the computational results are interdependent, rather than independent, among the stages in the chain. Significantly, the decoding of an arithmetic string code is an illustration of such interdependence when contemplating a pipeline burp-free process.

In binary arithmetic encoding, one of two possible symbols (0 or 1) are encoded at each step. Generality derives from the fact that blocked (and other) data can be encoded in steps, one for each bit. The arithmetic encoding process as described in the above-named Langdon, et al, references does not use any predetermined code word. More particularly, as described in the copending 285 application, the encoding process directly uses an estimate of the probability of occurrence of a "0" or "1". This use of a probability estimate is the property which distinguishes arithmetic code strings from the compression encoding approach of Huffman. Huffman codes are described in Abramson, "Information Theory and Coding," McGraw Hill, 1963, pages 77-85.

In the Langdon, et al, application, it is the estimate of the probability of the less probable symbol (LPS) which is approximated to the nearest value of the form $2^{-k}$. Furthermore, an ordered pair $(L, k) = Q$ is used as a control descriptor in which "L" denotes the LPS value and "k" denotes the integer power of 2. The descriptor Q saves storage space over code words which otherwise could become large and also is convenient for adaptation.

The binary arithmetic coding as described in the co-pending 285 application generates an instantaneous FIFO binary arithmetic code string C(sb). This string is recursively formed by the high to low order pairwise combining of digits of a decodable set of relatively shifted finite binary number strings C(s) and/or A(sb). C(s) is the encoded string corresponding to source string s, and A(sb) is an augend function for symbol b given prior string s. The encoding action is in response to each binary symbol b occurring in the symbol string s. In this latter regard "q" of the lowest order bits of each string C(s) and A(sb) are combined during each recursion. Lastly, arithmetic code string carries are controlled through control character insertions after predetermined length runs of consecutive 1's.

In order to appreciate the subsequent discussion of the invention, consideration should first be given to aspects of the prior art FIFO encoding and decoding. Firstly, the encoder is similar to a finite state machine whose internal state may be represented by number T. Also, as a processor of values in recursive relations the encoder contains a q bit "working end" of the code string in a designated register. The problem is for the encoder to ascertain whether the symbol b to be encoded is the less probable symbol (LPS) or the more probable symbol (MPS), as well as determining the integer value control parameter (skew number) k. In the encoding action, the encoder forms a trial augend (TA). TA is related to T and k by $TA = T \times (1 - 2^{-k})$.

If the encoder determines that the symbol to be encoded is LPS, then the encoder adds TA to the working end of the code stream so as to form a new working end. At the same time, the encoder left shifts out k bits from the working end of the code string and similarly shifts the contents of the designated register (register C). The internal state T of the encoder remains unchanged. On the other hand, if the symbol to be encoded is MPS, the encoder does not add TA to the working end of a code string. Rather, the encoder tests for normalization. The test for normalization involves the leftmost bit of TA. If the leftmost bit is "1", then TA is already "normalized". A normalized value of T is assigned the value TA. If the leftmost bit of TA is "0", then the most significant bit in designated register C is outputted. Next, TA is normalized: left shifted one bit and assigned as the value of T. The designated register C is left shifted one bit.

It is apparent that the basic operations for encoding are adding, subtracting, and shifting.

Relatedly, the decoder as described in the copending 285 application needs only to subtract and shift. The decoder has the q most significant bits of the code stream in a designated register C and has an internal state represented by the number T.

Assuming that the decoder has knowledge of the integer-valued control parameter k, then the decoder forms trial augend TA according to $TA = T \times (1 - 2^{-k})$. At this point, the value TA is substracted from the contents of register C. If the difference is negative, a borrow-out occurs and it is concluded that the decoded symbol was the MPS. If a normalization occurs, TA is shifted left to form T. The contents of register C are left shifted as well.

If the difference $TC = C - TA$ is positive, then the decoded symbol is LPS. On this occasion, the difference $TC = C - TA$ is shifted left by k bit positions. The difference is also restored to register C with the "fill" coming from the next k most significant bits of the code stream C(s). Again, the value of the internal state T remains unchanged.

THE INVENTION

It is an object of this invention to devise a method and means for ensuring continuous and uninterrupted information flow through a synchronously coupled multi-stage pipeline processor. It is a related object that such continuous and uninterrupted information flow applies particularly to the serial decoding of the digits of a FIFO Rissanen/Langdon arithmetic string code of binary sources.

The above objects are satisfied in an embodiment of an apparatus for ensuring continuous flow through a pipeline processor as it relates to the serial decoding of FIFO Rissanen/Langdon arithmetic string code of binary sources. The pipeline decoder includes a processor (11, 23) and a finite state machine (21, FSM) in interactive signal relation. The processor generates output binary source signals (18), status signals (WASMPS, 31) and K component/K candidate next integer-valued control parameters (L0, k0; L1, k1; 25). These signals and parameters are generated in response to the concurrent application of one bit from successive arithmetic code bits, a K component present integer-valued control parameter (52), and K component vector representation (T, TA) of the present internal state (51) of the associated finite state machine (FSM). The FSM makes a K-way selection from K candidate next internal states and K candidate next control parameters. This selection is made in no more than $K^2+K$ computation cycles. The selected signals are then applied to the processor in a predetermined displaced time relation to the present signals in the processor. As a consequence, this system takes advantage of the multi-state or "memory" capability of an FSM in order to control the inter-symbol influence and facilitate synchronous multi-stage pipeline decoding.

It is a further aspect of this invention that the processor comprises a shift and subtract circuit for magnitude comparison between the arithmetic code string and an updated trial augend for purposes of generating the binary source symbol output. The FSM uses status signals from the processor and the FSM's present internal state for making the K-way selection of the next trial augend in overlap relation with the shift and subtract decode operation of the first processor.

DESCRIPTION OF THE BEST MODE AND APPLICABILITY

The particular problem solved is that of constructing a high-speed decoder for a data compression code. The general problem solved is the design of a pipeline where a finite state machine (FSM) comprises one of the functions (or subfunctions) to be performed. That is, the system has upstream controls (signals) from downstream in the pipeline which influence the output and next state of the upstream pipeline unit. The present embodiment depicts the high-speed decoding of a compressed binary stream using the binary multiplicative arithmetic code described in the co-pending application, Langdon, et al, U.S. Ser. No. 098,285, filed Nov. 29, 1979.

The ensuing description will first set out the decoder environment and consider the decoding steps in both parsing and interpreting the bits of the received binary number string. This introductory section ends with a discussion of the functional partitions which can be made of the decoder into sub-units. This section is followed by the specific description of the problem, the solution, and its implementation in several aspects.

Arithmetic string encoding involves the encoding and decoding of one-bit binary symbols (0 or 1) under statistics summarized by an r-bit quantity Q. Q includes a description of the less probable symbol (LPS). Q could be formed, for example, of five bits, one bit of which, designated L, denotes whether 0 or 1 is less probable; and a skew number k which indicates that the probability of L, i.e., p(L) is approximated by $2^{-k}$.

Figure 1:
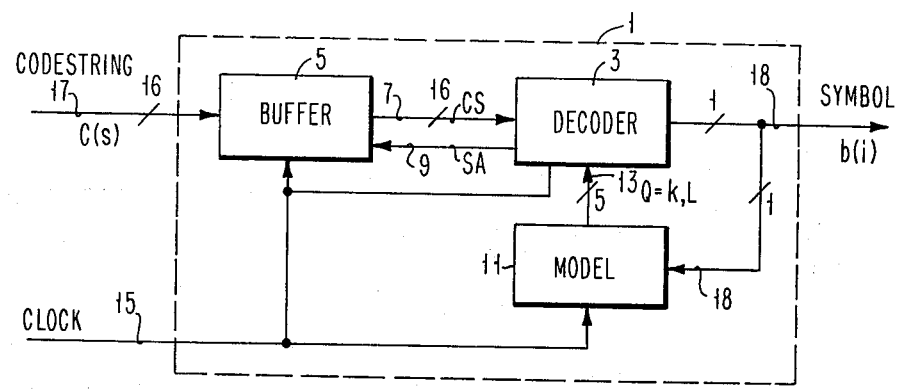
FIG. 1 represents a receiver block diagram suitable for decoding binary number strings.

Referring now to FIG. 1, there is shown a block diagram of receiver 1, including a binary arithmetic decoder 3 in its environment. A buffer unit 5 provides the decoder 3 with input C(s) over path 7. The buffer takes the next, say, 16 bits of decode string C(s) and properly aligns it. Buffer 5 receives from the decoder 3 a signal SA on path 9. SA denotes "shift amount". SA indicates how many bits of C(s) were transferred from buffer 5 to decoder 3. A model unit 11 provides decoder 3 with the skew Q of the next bit to be decoded as one of the five bits in the ordered pair Q=(L, k) transmitted over path 13. This skew Q is the same as was used by the encoder (not shown). Decoder 3 emits a 1-bit symbol b(i) during each decoding cycle as governed by a clock signal over path 15. The clock signal on path 15 coordinates (synchronizes) buffer 5, decoder 3 and model unit 11.

Figure 5:
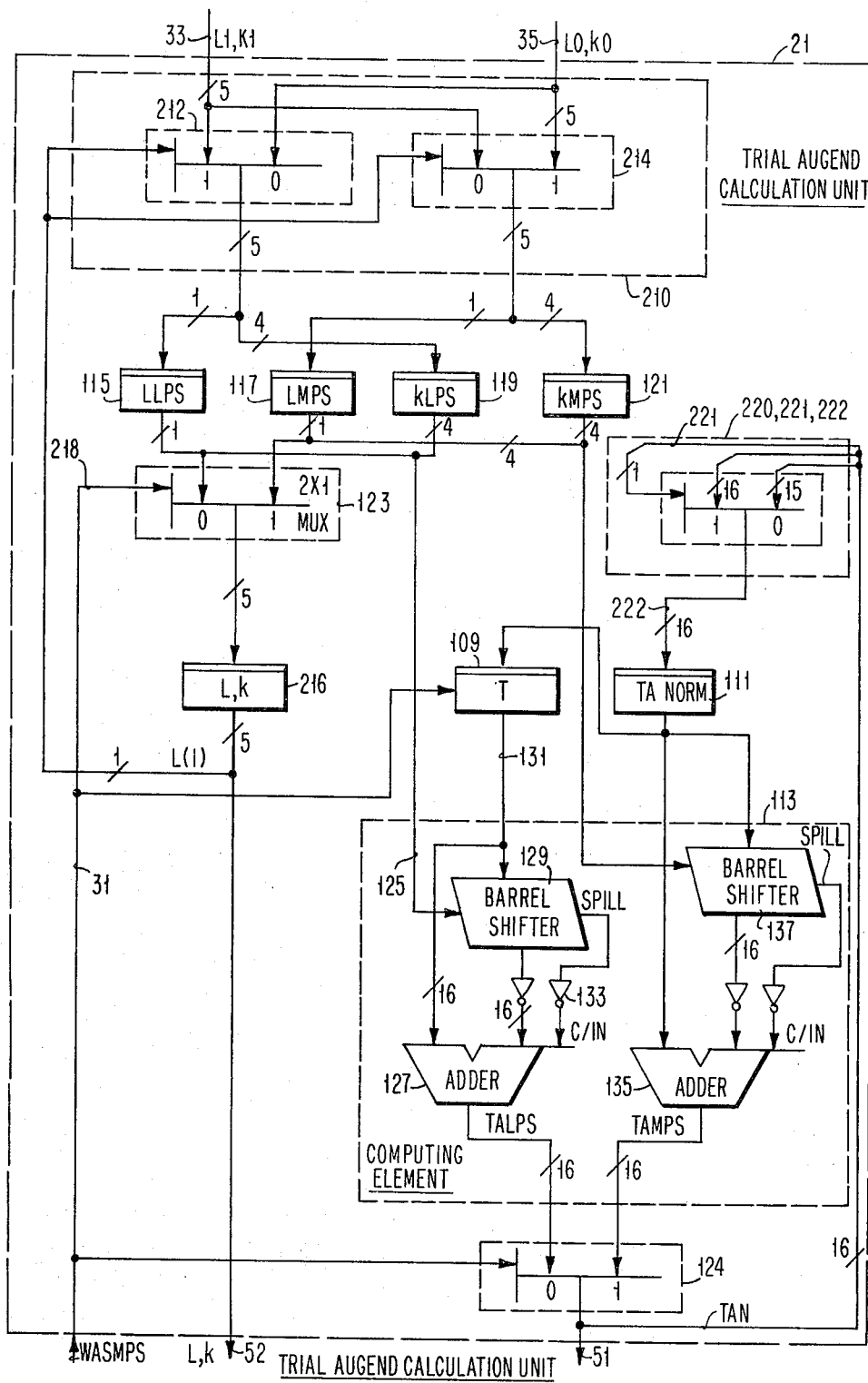
FIG. 5 sets out the detailed logical data flow for the trial augend calculation unit of the upstream processor.
Figure 6:
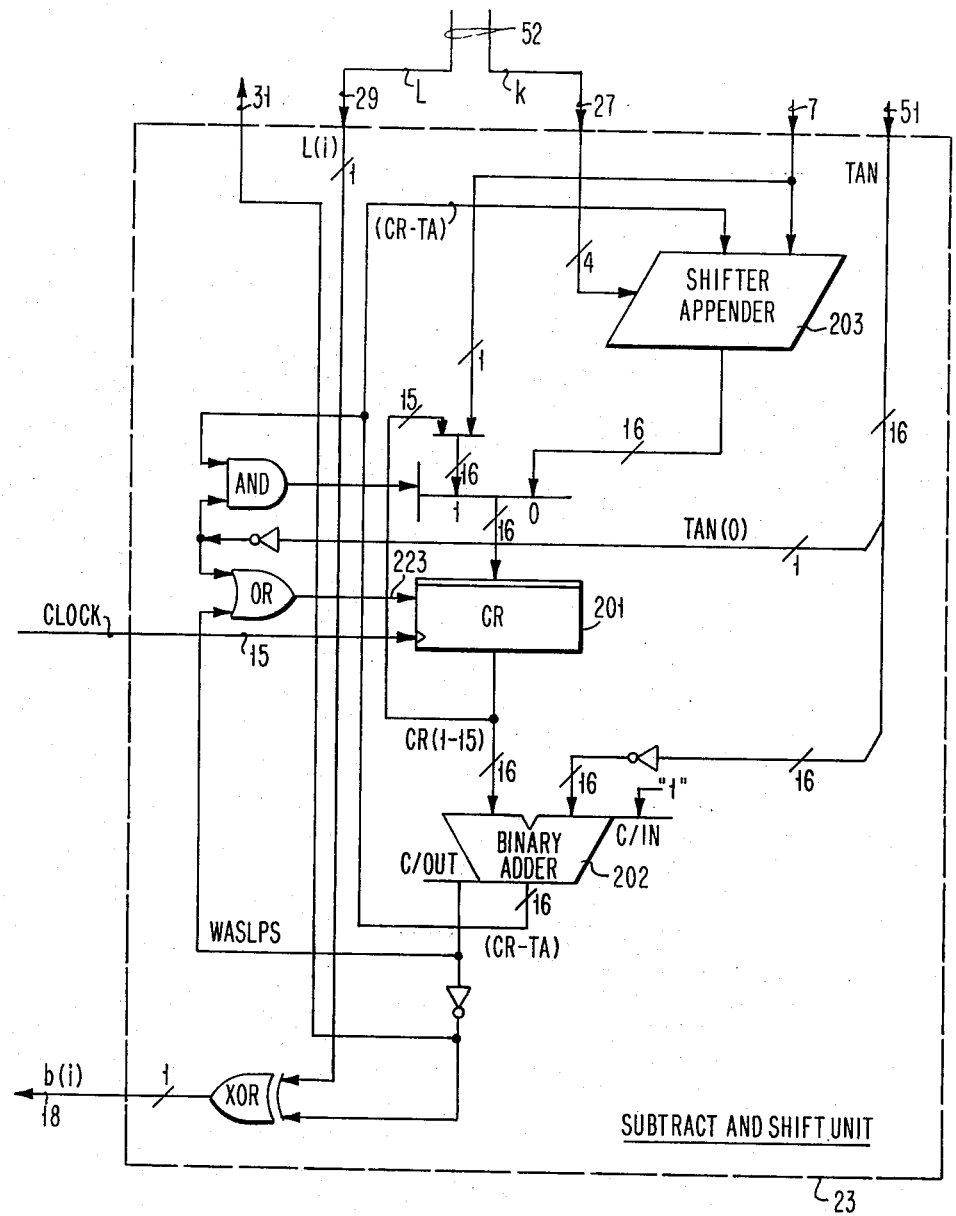
FIG. 6 shows the logic and data flow for the shift and subtract unit which forms the downstream processor.

The source data string originally encoded to form the code string C(s) is itself denominated s=b(1) b(2) ... b(i) ... b(m), where the symbols "b" are bit values (0 or 1). The encoded source string C(s) is applied as an input on path 17 of receiver 1. Both the encoding and decoding processes involve a double recursion. The first recursion concerns the code string C(s), while the second recursion includes an internal variable T(s). In the decoder embodiment, T is stored as a running parameter in a 16-bit register 109 in trial augend calculation unit 21 as depicted in FIG. 5. String C(s) is long, and for the decoding operation only the q-most significant bits of the string remaining at any instant are utilized, i.e., let q=16. In order to initialize the decoding process, the leftmost q=16 bits of C(s) are placed in a 16-bit register CR 201, as shown in FIG. 6 of the shift and subtract unit 23. Further, register T is set to all 1's. It should be remembered that the decoding process is the dual of the encoding process. During encoding, augends were added to the code string C(s) and the result was shifted left. For decoding, augends are subtracted and the result left shifted.

The decoder must perform several sequential steps before the value of the decoded bit stream is known. Initially, the value of Q under which the next bit was encoded and the value of T are known. These steps were previously described in the background portion of the specification. It is sufficient to remark that as the string C(s) is decoded, the higher order bits in register CR 201 (FIG. 6) are converted to 0's by the subtraction operations. As the CR contents are shifted left, these 0's are shifted out and the lesser significant bits of string C(s) are shifted left into register CR, filling the vacated positions in the register. Therefore, the 16 next most significant bits of C(s) must feed a shifter ready to be reinserted to their new positions when CR is shifted. In this regard, reference should be made to shifter appender 203, FIG. 6. In this invention, the focus is in "pipelining" this operation. This means that the steps are performed concurrently. These are performed, however, only for the decoding of different bits. It is the case that the symbols of the source string s are indexed, for which a suitable substring could be represented by $b(i-2)$, $b(i-1)$, $b(i)$, $b(i+1)$, $b(i+2)$. With indexed symbols, the decoding operation may be described as follows in terms of the information required to decode bit $b(i)$, which are stored in, or available to, the decoder:

1. The aligned value CR(i) which results after decoding symbol $b(i-1)$.
2. The value of internal value T(i), updated after decoding $b(i-1)$.
3. The values of k(i) and LPS l(i), resulting from the model unit 11 function on $b(1) \ldots b(i-1)$. This is the past history of the source string.

Suppose the decoding operation could be partitioned to 3 steps as follows:

1. Using the past history of the so-far-decoded source string, let the model unit 11 determine the context uner which the next bit b(i) was encoded and determine $Q = L(i)$, k(i).
2. Using the value of the internal variable, T(i) and k(i), calculate the value of the trial augend according to the relation $TA = T \times (1 - 2^{-k})$. When the value of the decoded bit is determined, i.e., MPS or LPS, then internal variable T(i) is updated to T(i=1) such that for b(i) being the LPS, then T is unchanged; and for b(i) being MPS, then T(i+1) is the normalized value of TA(i).
3. Subtract TA from the aligned value of the CR register 201 (see FIG. 6, register 201). If the result is negative, then the valve b(i) is decoded as MPS and the contents of CR are left unchanged unless bit TA(0) is "0". In this latter case, the contents of register CR are shifted left one bit, which corresponds to a normalization of T. If CR−TA is "0" or positive, then the value b(i) is LPS. The result (CR−TA) is shifted left k bits. The updated value CR(i+1) is thus $$[CR(i) - TA(i)] \times [2^{k(i)}].$$

Whenever CR(i) is shifted left, then the vacated positions are filled through a shifter from the next most significant bits of the remaining code string C(s).

Figure 2:
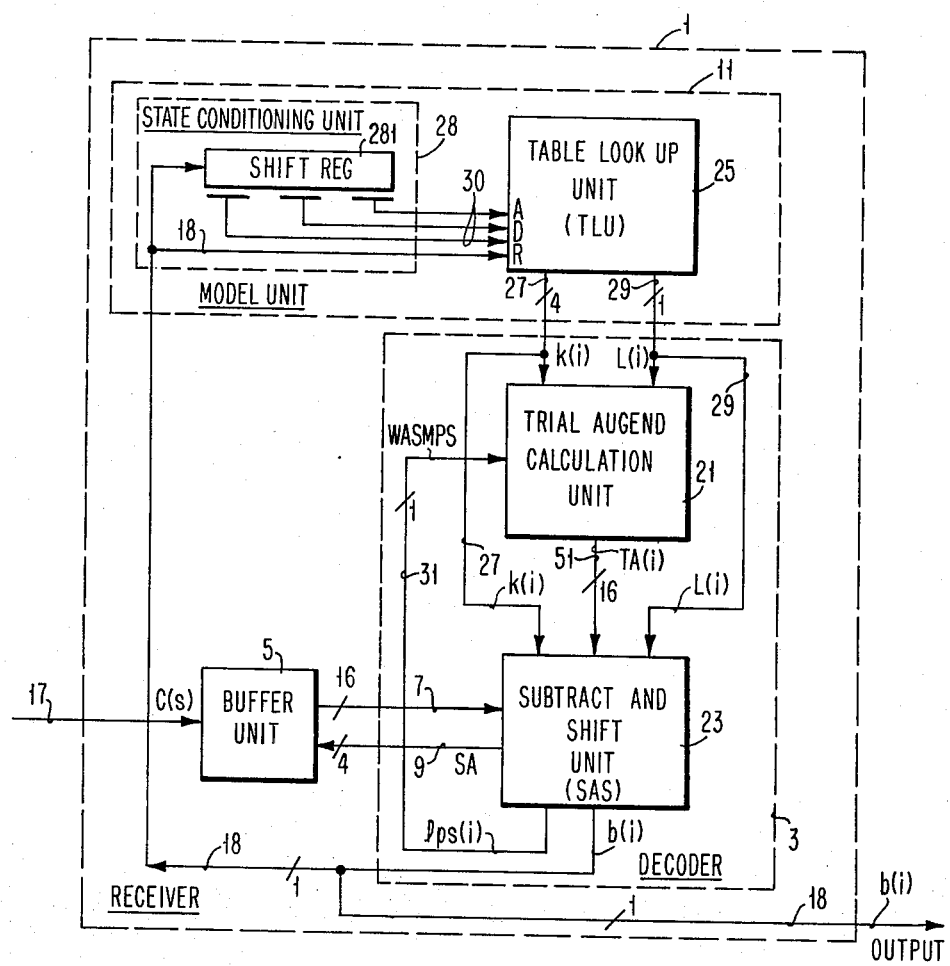
FIG. 2 shows receiver logic including the decoder and model units interacting with a buffer.

Refer now to FIG. 2, there is shown the receiver logic, including the decoder 3 and model unit 11. The above-mentioned 3-step partition is functionally embodied in the apparatus. The buffer unit 5 manages the code string and furnishes the higher order bits of C(s) as required. Model unit 11 provides the value of skew $(L, k) = Q$ to the decoder 3.

Step 1, i.e., that of aligning values and updating the variables, can be implemented by a table look-up procedure. Attention is directed to model unit 11 in FIG. 2. This model includes a state conditioning unit 28 formed from a shift register 281, parallel path readout means 30 and a table look-up unit 25. The output of decoder 3 is fed back over path 18 into shift register 281 of state conditioning unit 28. The instantaneous present output b(i), together with the past history $b(i-1)$, $b(i-2)$, $b(i-3) \ldots$ on path 30, constitutes the address for accessing a 5-bit quantity from table look-up unit 25 (TLU). The output from the TLU consists of $(L,k) = Q$. This is respectively the 4-bit skew number k and the 1-bit LPS value of L, and appears on respective paths 27 and 29. The most recently decoded symbol b(i) is fed back on line 18 and, as mentioned previously, contributes one bit of the multibit address used by the TLU unit. This is of importance, since the intersymbol statistical dependence is quite high.

It should be recalled that the functions included within Step 2 both operate upon internal variable T for the next state, as well as calculate the output, trial augend TA. Hence, the apparatus for implementation is called the trial augend calculation unit (TAC) 21. Also, the value of the most recently decoded symbol, whether MPS or LPS, is required information for TAC in order to determine the value T(i+1).

The functions included within Step 3 determine the value b(i) by way of a subtraction operation. The result is then shifted left by 0, 1, or k bits. Hence, the apparatus embodying the Step 3 functions is called the SUBTRACT AND SHIFT UNIT (SAS) 23. SAS receives the value k(i), L(i), and TA(i) from the TAC unit. The SAS also receives the leading bits from the code string C(s) from buffer unit 5. These leading bits fill the vacated position of the dedicated register CR within the SAS. In turn, the SAS outputs the value b(i) and LPS (i).

Suppose that the embodiment in FIG. 2 were operated in an overlapped manner. This results from the fact that the delays of each unit occur in series. For example, once b(i) is known, the TLU obtains k(i+1) and L(i+1). From MPS (i) the TAC updates the internal variable T(i+1). From k(i+1), the TAC calculates TA(i+1) and awaits the result LPS(i+1) before updating T. In turn, the SAS unit calculates LPS(i+1) from the values CR(i+1) and TA(i+1). Likewise, SAS calculates b(i+1) from LPS(i+1) and L(i+1).

Before the next cycle can be started, all of these circuit delays need to have transpired. The sum of the delays through each unit determines the minimum time the decoder can be cycled.

It is clear, then, that an increase of speed could be achieved if the three units, i.e., model unit 11, TAC and SAS could be operated parallel. Thus, the minimum time of cycling the decoder unit would be the maximum delay through one of the three units instead of the sum of the maximum delays of the three units.

One form of parallel operation is achieved in a pipeline fashion. For example, the TLU would generate the values k(i+2) and L(i+2) while TAC would update the trial augend TA(i+1). Overlapped with this SAS would compute b(i). Unfortunately, the TLU must know b(i) and b(i+1) before it can generate k(i+2) and L(i+2). Likewise, the TAC must know LPS(i) before it can determine T(i+1) which is needed in order to calculate TA(i+1).

Figure 3:
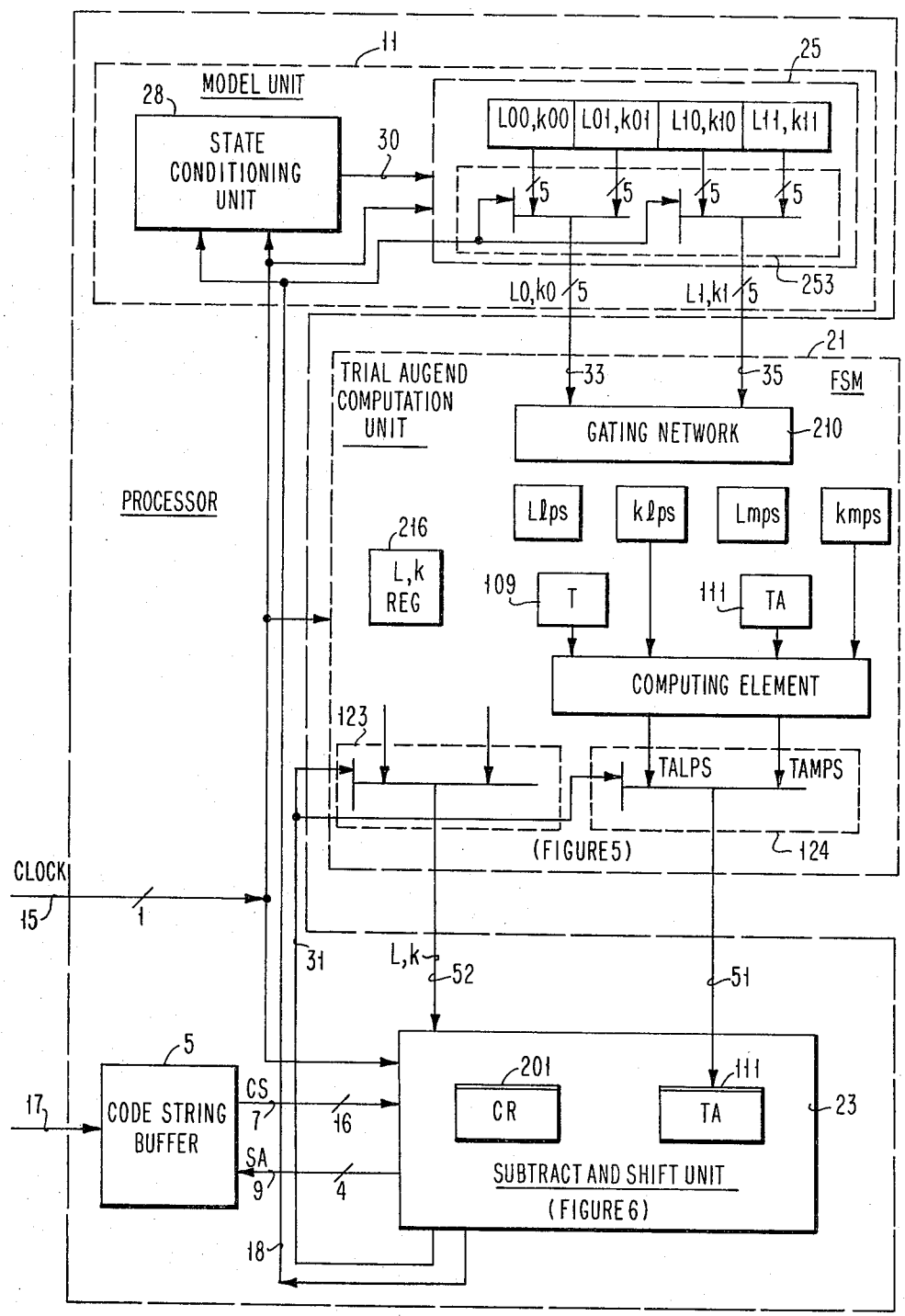
FIG. 3 is a receiver block diagram and external connections of the pipeline decoder illustrating the selection circuitry between the trial augend unit and the shift and subtract unit.

Referring now to FIG. 3, there is disclosed a block diagram of the invention, showing the model unit, TAC, and SAS, their registers and the interface signals. Of interest here are the global, rather than the local aspects of the invention.

It is an object of this invention to increase the speed of pipelined binary string decode operations. In this regard, it was unexpectedly observed that if the TLU calculates for possible values for b(i+2) from the ordered pair (L,k) then even though the values b(i) and b(i+1) are unknown, they together nevertheless be limited to only four possibilities, 00, 01, 10, and 11. In this regard, the table look-up operation within the model unit 11 would fetch values of L, and k for each of the four possibilities. At the end of the cycle, the SAS unit determines the value b(i), which can be used as a control signal to select two possibilities of L,k to pass on to the TAC unit. This means that only b(i+1) is unknown. For its part, TAC can calculate two trial augends. One trial augend, if b(i) is LPS. This is designated TALPS(i+1). The second trial augend calculated by TAC occurs for the case where b(i) is MPS. This, in turn, is designated TAMPS(i+1).

The ambiguity for TAC is that without knowledge of whether b(i) was LPS or MPS, it cannot determine the value for internal variable T(i+1). Significantly, only two possibilities exist. Either b(i) was MPS or it was not. Therefore, TAC unit determines two values for T(i+1). The first value for the case of the symbol b(i) is LPS. The second value is if b(i) is MPS.

Corresponding to each of these possibilities are the values for the ordered pair (L,k). Consequently, knowing TLPS(i+1) and kLPS(i+1), then TALPS(i+1) can be calculated. The same holds for TAMPS. At the end of the cycle, the value b(i) and whether it "was MPS" has been determined by the SAS. The TAC which can use the information value on signal designated as WASMPS in order to select which of the two calculated trial augends to use during the next cycle.

Referring again to FIG. 3, the data selector 253 in TLU unit 25 may be formed from 2×1 MUX units. Each of the four ordered pairs (L00,k00); (L01,k01); (L10, k10); (L11,k11) is applied two pairs at a time to respective ones of the MUX units. The value of b(i) on path 18 conditions which one of the respective pair will appear on the counterpart path 33 and 35 to be applied in turn to the TAC. The TLU determines the Q value pairs with respect to k(i+2) and L(i+2), while the TAC processes TA(i+1) and k(i+1). Overlapped with this, the SAS unit decodes b(i) as applied to the TLU unit. SAS also generates WASMPS (i) sent to the TAC over path 31.

The conditioning class address minus the bits representing b(i) and b(i+1) does the look-up in, for example, a 20-bit wide memory instead of one 5 bits wide. The proper ordered pair (L,k) is selected once b(i) is known. The selected pair on either path 33 or 35 is then passed to the TAC unit. As mentioned, the SAS unit receives L(i), k(i), over line 27 and TA(i) on line 51. It should be noted that a 2×1 MUX status selector is controlled by the WASMPS output on path 31 in the electrical connection between TAC and SAS.

Referring now to FIGS. 2 and 3, it is apparent that TAC and SAS may be viewed respectively as an upstream and downstream processor. Indeed, the unpipelined TAC unit in FIG. 2 may be characterised as an FSM with the value T as its internal state. With reference to FIG. 2, it is clear that from the value T, the value of TA is calculated. From the value TA, the outcome "WASMPS" may be calculated by the downstream processor SAS. From WASMPS, the next value T is calculated. In this context, the signal WASMPS may be viewed as a control signal passed upstream back to the TAC. This is designated as "upstream control."

In order to effectuate the type of overlapping constituting synchronous and uninterrupted information flow through a pipeline processor, it would be desirable to begin calculating the next value of TA from the next value of T on the next cycle. Unfortunately, the next value of T is not determined until the old value of TA is used for the generation of WASMPS. Restated, although TAC is a finite state machine, the next state function result is not available at the end of a cycle. However, through the use of this invention at the end of the cycle, the value of the next state function can be narrowed to one of two posibilities. If each of the possibilities is treated as "a present state", then two candidate values of TA can be calculated, one from each "present" state. However, from each present state, there will be two next-state possibilities. This results in making four next-state calculations. At the end of a cycle, a selection should be made as to the next present-state pair and the value of TA to pass it on to the SAS. This is diagramatically shown in FIG. 4. In the general case, if the upstream control signal has k possible values, then $k^2+k$ quantities would have to be calculated.

Figure 4:
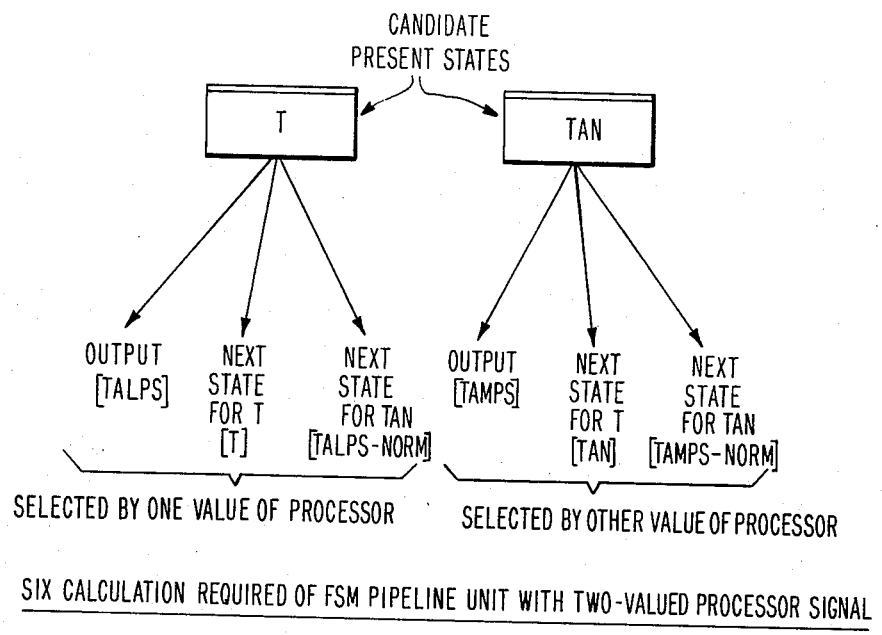
FIG. 4 depicts the K-way selection resolvable by the upstream processor (model unit and trial augend computation unit).

Referring now to FIG. 5, there is shown implementation of the TAC for calculating the 6 quantities depicted in FIG. 4. The TLU unit passes to the TAC unit 21 two 5-bit quantities (L00,k00); (L01,k01); (L01,k10); (L11,k11). If b(i) is "0", then L0k0 is the correct ordered pair Q. If b(i) is "1", then L1k1 is the correct Q. Once b(i−1) is known, then L(i), the value of the least probable symbol for bits position i, is known. As an example, before symbol b(1) is decoded, to value L(1) is known. The values L0(i+1), k0(i+1), L1(i+1), and kMPS(i+1) can be readily converted into LLPS(i+1), kLPS(i+1), LMPS(i+1), and kMPS(i+1) using the value L(i). If L(i) is "0", then LLPS and kLPS are equal to L0 and k0, respectively, while LMPS and kMPS are L1 and k1, respectively. On the other hand, if L(i) is "1", then LLPS and kLPS are L1 and k1, respectively, while LMPS and kMPS are L0 and k0, respectively. Gating network 210 in FIG. 3 is shown implemented in FIG. 5 by a pair of 2×1 MUX curcuits 212 and 214. The MUX circuits have their inputs cross-connected such that path 35 is terminated in a 1 input for MUX 214 and a 0 input for MUX 212. Path 33 is terminated in a "1" input for MUX 212 and a "0" input for MUX 214. The L(i) output from register 216 controls the Q value to be selected by way of the L(i) signal applied over path 218.

What is required is to determine a pair of values for the internal variable T, stored in register 109, T assuming one value if b(i) is LPS and the other if b(i) is MPS. In order to decode symbol b(1) in the first bit position of the source string, on the first cycle for the TAC, the value T(1) is the initial value, i.e., 0.11111 . . . 1 since L(1) and k(1) are known, then TA(1) is determined. For the second cycle, the TAC must calculate TALPS(2) and TAMPS(2) without knowing the value b(1).

Assume that the TLU unit has passed L0,k0, L1,k1 for bit position 2. Since L(1) is known, these can be converted as previously described to LLPS(2), kLPS(2), LMPS(2), and kMPS(2). Values TLPS(2) and TMPS(2) must be calculated for bit position 2. This may be accomodated if b(1) is LPS, then TLPS is T(1), because the occurrence of the LPS symbol leaves T unchanged according to the algorithm. On the other hand, if b(1) is MPS, then TMPS is "TA(1) normalized." This is denoted by TA(1) NORM. Consequently, the values for TAMPS and TALPS for bit position i+1 are defined by the following relations:

$$\text{TAMPS}(i+1) = [\text{TA}(i)\text{NORM}] \times [1 - 2^{-kMPS(i+1)}] \quad \text{Eq. (2)}$$

$$\text{TALPS}(i+1) = T(i) \times [1 - 2^{-kLPS(i+1)}] \quad \text{Eq. (3)}$$

It remains to show, at the end of the cycle for position i+1, that the updated value for the righthand side of the above relations are achievable, given that the SAS unit generates the value WASMPS(i+1) at the end of its cycle and is applied to TAC over path 31. The following relations express the observation that the right-hand side of equations 2 and 3 is indeed obtainable for the next cycle.

In order to obtain LLPS(i+2), . . . , kMPS(i+2), the values from TLU and the value L(i+1) are needed. L(i+1) is obtained from relations:

WASMPS(i+1): L(i+1)=LLPS(i+1);
k(i+1)=kLPS(i+1)    Eq. (4)

WASMPS(i+1): L(i+1)=LMPS(i+1);
k(i+1)=kMPS(i+1)    Eq. (5)

In equations 4 and 5, the new value of L is used to convert L0, . . . , k1 to the required value in terms of LLPS, . . . ,kMPS. Note that the value k(i+1) is now known. Thus, this value may be passed on to the SAS unit. The value k(i+1) is needed so that the SAS unit knows the amount to shift left register CR (depicted as register 201 in FIG. 6) in case the symbol b(i+1) was LPS.

It should be observed that in equations 2 and 3, two candidate values for the internal variables T, and TA are used. The first is TA(i) normalized and the other is T(i). Following the determination of WASMPS(i+1), it is then possible to determine TA(i+1)NORM and T(i+1). Such a determination can be made from the following relations:

WASMPS(i+1):
 TA(i+2)NORM=TALPS(i+1)NORM:
 T(i+1)=T(i)    Eq. (6)

WASMPS(i+1):
 TA(i+2)NORM=TAMPS(i+1)NORM;
 T(i+1)=TA(i) NORM    Eq. (7)

With reference to FIG. 5, a typical cycle is described. Values LLPS, LMPS, kLPS and kMPS are in respective registers 115, 117, 119 and 121. Internal states T and TA norm are in respective registers 109 and 111 at the start of a cycle. Eq. 2, to calculate TAMPS, is embodied by shifter 129 responsive to kLPS signal 125, adder 127 which subtracts the shifted T from itself, forming TALPS. Similarly, Eq. 3 is embodied by shifter 137 and adder 135, forming TAMPS. At the end of the cycle, one of candidates TALPS and TAMPS is selected through MUX 124, forming TAN 51. Selection signal WASMPS 31 is generated by SAS. If WASMPS 31 is "1", TAMPS is passed through MUX 124; otherwise TALPS is passed.

Bus TAN 51 goes to SAS, but also feeds MUX 220. Select signal 221 is the most significant bit TAN(0), which if "0", calls for normalization. The normalized bus 222 is loaded into TA norm at the end of the cycle. WASMPS also selects the value L, K to be passed to the SAS unit along with TAN. This is done by MUX 123, feeding register 216. MUX 123 implements equations 4 and 5, and register 216 holds the result for SAS for the next cycle. WASMPS 31 also controls the proper permutation through unit 210 of values LLPS, LMPS, kLPS, and kMPS from the inputs L1, k1, 33 and L0, k0, 35, furnished by the TLU unit 25.

Eq. 6 is implemented by clocking into TA norm the normalized value selected for TAN and leaving register T 109 alone. Eq. 7 also selects normalized TAN, but transfers the value of TA norm to T for the next cycle.

While TALPS and TAMPS are being calculated during a cycle, the values L, K 52 and TAN 51 calculated and selected on the previous cycle are controlling the action of the SAS unit. Toward the end of the SAS unit cycle, concomitant with the TAC unit cycle, the subtractor determines the value of MPS. This causes WASMPS 31 to be 0 or 1, and accordingly select the value for the next TAN 51, L, k 216, and permutation LLPS, LMPS, kLPS and kMPS in unit 210.

Refer now to FIG. 6. There is shown subtract and shift unit 23. This unit was first shown and described in the above-mentioned co-pending U.S. application filed by Langdon, et al, as U.S. Ser. No. 098,285 on Nov. 29, 1979, at FIG. 5 and specification page 30, line 3 through page 35, line 11.

Since the SAS unit of FIG. 6 has been described elsewhere and is considered prior art to this invention, its function is only briefly reviewed. In this regard, register CR 201 holds the working end of the code string being decoded, with the next lesser significant bits waiting on bus 7 to be shifted and appended through unit 203 to replace the bits of CR 201 which are shifted out. At the start of the cycle, value TAN 51 is subtracted from CR 201. Adder C/OUT signal, called WASLPS, is inverted to generate signal WASMPS 31. If signal WASMPS is active, then CR is shifted left only if TAN(0) is "0", signifying normalization. On the other hand, if WASLPS is active, then the adder output is shifted k27 bits through shifter appender 203 and restored to CR. If the decoded symbol was not LPS, and if TAN(0) is not "0", then CR 201 remains unchanged because its input EN 223 is not enabled.

There has been disclosed and described a method and means for ensuring continuous and uninterrupted information flow through a pipeline processor. It should be appreciated, however, that without this pipelining invention, the delay which determines the fastest cycle time includes a flip-flop propagation delay tP(FF) to store value b(i), and the contents of CR register 201 of SAS unit 23, a table look-up access delay tA(TLU), a 16-bit barrel shifter propagation delay tP(shift) for augent TA, a subtractor propagation delay tP(sub) for the addend TA, a 16-bit subtractor delay tP(sub) for the value CR−TA, and a 16-bit shifter delay tP(shift) to realign CR−TA by a k-bit shift, and finally a flip-flop set-up delay tSU(FF) for the edge-triggered flip-flops which are used in the embodiment. The delay is thus equal to the sum of the incrmental delays as expressed by DELAY=tP(FF)+tA(TLU)+2tP(shift)+2tP(sub)+tSU(FF).

With the pipelined approach, the delays occur in parallel so that the delay determining the fastest cycle time is the maximum of the individual unit delays. In this embodiment, the three units which are overlapped are the TLU, the TAC and the SAS. Their delay times may be represented as follows:

tC(TLU)max=tP(FF)+tA(TLU)+2tP(MUX)+tSU(FF)

tC(TAC)max=tP(FF)=tP(shift)+tP(sub)=2tp(MUX)+tSU(FF)

tC(SAS)max=tP(FF)+tP(sub)+tP(shift)+tP(MUX)+tSU(FF)

It is to be understood that the particular embodiment of the invention described above and shown in the drawing is merely illustrative and not restrictive of the broad invention. It is clear that the output value of the final decoder unit of the pipeline in this invention influences the upstream units via an upstream control signal "WASMPS". Since the final unit (SAS) output must select between two candidate inputs to the SAS, then the TAC unit must generate two candidate outputs. If a unit output, i.e., from the TLU is two pipeline units (hence, two clock times) away from the last (SAS) unit output, then the pipeline must work on four possible outputs if the SAS unit current output depends on the two previous outputs. This increases by a power of two for each clock time. In this invention, the decoder in pipeline operation includes a finite state machine (FSM). This is the TAC unit. In the non-pipeline implementation, the internal variable T is the internal state. An FSM not only delivers an output each cycle, but updates an internal state. The output is a function of the input and the internal state.

Figure 7:
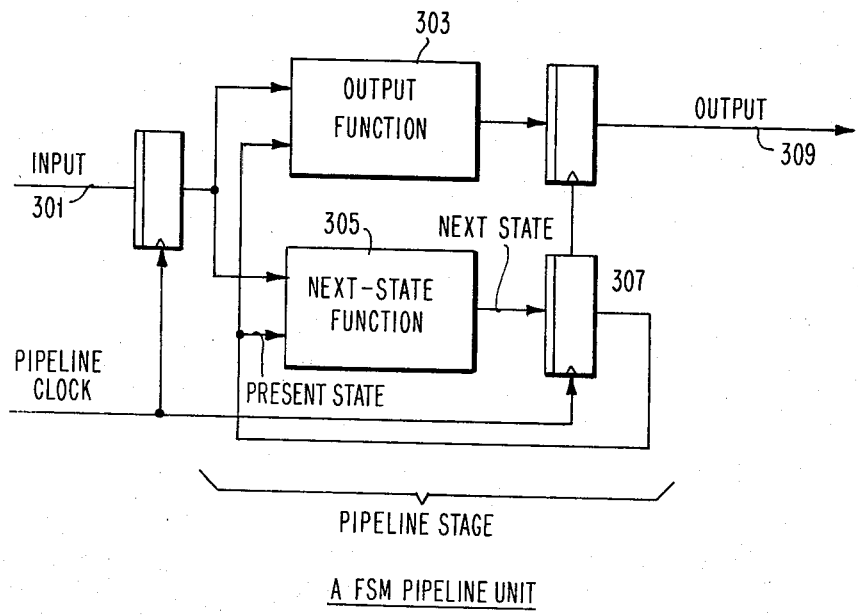
FIG. 7 is a FSM pipeline unit, that is, a classical FSM-found prior art.

When an FSM is a pipeline unit for element, the idealized block diagram may be seen, for example, in FIG. 7. There, output function 303 will be outputted on path 309 only as a joint condition of the next state function 309 and the input 301.

It is an aspect of this invention that the pipeline of the next state function occurs without interruption of the pipeline. This means that at each pipeline clock, a new input value and a new present state value are presented. In the event that there are delays, as for example in the output of the next state function, then there is a "burping" of the data stream throughput. This is cured in this invention by pipelining the next state function such that the next state is clocked out by a signal coming from a downstream unit rather than the synch unit.

I claim:

1. A recursively operating information handling system comprising a processor (11, 23) and a finite state machine (21, FSM) in interactive signal relation, CHARACTERIZED IN THAT:

the processor includes:
  means (FIG. 6/201, 202) for generating output signals (18), K component/K candidate next integer-valued control parameters (L0, k0; L1, k1; 25) and status signals (WASMPS, 31) jointly responsive to successive coded input signals (5, 7, 9), K component present integervalued control parameters (52), and a K component vector representation (T, TA) of the FSM present internal state (51);

the FSM includes:
  calculating means (113); memory means (109, 111, 115-121) for storing vector representations of the present and K next candidate FSM internal states and K next candidate control parameters; and means (FIG. 5/123, 216, 52; 124, 220) including the calculating means responsive to the generated status signals and parameters from the processor for accessing the memory means and for selecting the next internal state and next parameter by making a K-way selection from the K candidate internal states and the K candidate parameters.

2. A system according to claim 1, wherein the FSM executes the K-way selection in no more than $K^2+K$ calculations, and further wherein the vector representation of the next internal state and parameters are applied to the processor in predetermined displaced time relation to the present internal state vectors and parameters.

3. A system according to claim 1, wherein each K component vector representation of either a present or next FSM internal state consists of two components T, TA, in which T is an arbitrary number string and TA is a trial augend.

4. A system according to claim 1, wherein, the processor includes:
  register means (201) for storing successive coded input signals;
  means (5, 7, 15) for shifting said input signals into the input register means; and
  a subtract and shift circuit (FIG. 6/201, 202, 203) for executing a magnitude difference operation between the register stored input signals and at least one component of the K component FSM present internal state vector, and for generating an output signal responsive thereto.

5. A system according to claim 4, wherein the component of the present internal state used for executing the magnitude difference operation is an updated trial augend.

6. A system according to claim 1, wherein successive coded input signals form a FIFO arithmetic code string, and further, wherein successive output signals form a binary symbol string.

7. An apparatus for recursively decoding an instantaneous FIFO binary arithmetic number string into a series of binary source symbols comprising:
  first means (23) for generating a binary source symbol (18) by the magnitude comparison between a predetermined portion of an arithmetic code string applied thereto and an updated trial augend, said first means includes means (202, 203) responsive to a present integer-valued parameter for controlling the relative magnitude between the arithmetic code string and the updated trial augend; and means for generating a status signal (WASMPS, 31) identifying the Boolean value of the previous bit decoded;
  second means (11) responsive to the output signal for accessing K component/K candidate next integer-valued control parameters (L0, k0; L1, k1; 25) and
  third means (21) including a memory for storing vector representations of the present and K next candidate control parameters and K next trial augends for K-way selecting and updating the trial augend from said candidates and applying them to said first means in predetermined displaced time relation to the next candidate control parameters applied to said third means.

8. A recursively operated information handling system comprising a processor and a finite state machine (FSM) in interactive signal relation, the processor includes:
 means for generating output signals, K component/K candidate next integer-valued control parameters, and status signals jointly responsive to successive coded input signals, K component present integer-valued control parameter and K component vector representation of the FSM present internal state;

the FSM includes:
 calculating means;
 memory means for storing vector representation of present and K next candidate FSM internal states and K next candidate control parameters;
 means, including the calculating means, responsive to the status signal and parameters for accessing the memory means and for selecting the next internal state and next parameter by making a K-way selection from the K-candidate internal states and K candidate next control parameters using more than $K^2 + K$ computations, the selected next state signals being applied to the processor in predetermined displaced time relation to the present state signals, whereby substantially continuous and uninterrupted flow of data through the system is maintained.

* * * * *